United States Patent
El Dirani et al.

(10) Patent No.: US 9,905,565 B1
(45) Date of Patent: Feb. 27, 2018

(54) MEMORY CELL

(71) Applicant: STMicroelectronics SA, Montrouge (FR)

(72) Inventors: Hassan El Dirani, Grenoble (FR); Yohann Solaro, Singapore (SG); Pascal Fonteneau, Theys (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 15/464,537

(22) Filed: Mar. 21, 2017

(30) Foreign Application Priority Data

Aug. 31, 2016 (FR) ...................................... 16 58063

(51) Int. Cl.
| H01L 27/108 | (2006.01) |
| H01L 29/06 | (2006.01) |
| H01L 29/08 | (2006.01) |
| H01L 29/78 | (2006.01) |
| G11C 11/409 | (2006.01) |

(52) U.S. Cl.
CPC ...... *H01L 27/10802* (2013.01); *G11C 11/409* (2013.01); *H01L 29/0649* (2013.01); *H01L 29/0847* (2013.01); *H01L 29/7831* (2013.01); *H01L 29/7841* (2013.01)

(58) Field of Classification Search
CPC ............. G11C 11/409; H01L 27/10802; H01L 29/0649; H01L 29/0847; H01L 29/7831; H01L 29/7841
See application file for complete search history.

(56) References Cited

U.S. PATENT DOCUMENTS

| 7,608,867 B2* | 10/2009 | Charbuillet | ......... | H01L 29/7391 257/104 |
| 8,362,604 B2* | 1/2013 | Ionescu | .................. | B82Y 10/00 257/690 |
| 8,391,059 B2* | 3/2013 | Lu | ......................... | G11C 11/404 365/129 |
| 8,466,505 B2* | 6/2013 | Lai | .................... | H01L 21/28273 257/315 |

(Continued)

FOREIGN PATENT DOCUMENTS

FR 3009432 A1 2/2015

OTHER PUBLICATIONS

Wan, J. et al., "Progress in Z2-FET 1T-DRAM: Retention time, writing modes, selectric array operation, and dual bit storage," Solid-State Electronics, vol. 84, Mar. 13, 2013, pp. 147-154.

*Primary Examiner* — Harry W Byrne
*Assistant Examiner* — R Lance Reidlinger
(74) *Attorney, Agent, or Firm* — Seed IP Law Group LLP

(57) ABSTRACT

A microelectronic component is capable of being used as a memory cell. The component includes a semiconductor layer resting on an insulating layer and including a doped source region of a first conductivity type, a doped drain region of a second conductivity type, and an intermediate region, non-doped or more lightly doped, with the second conductivity type, than the drain region, the intermediate region including first and second portions respectively extending from the drain region and from the source region. An insulated front gate electrode rests on the first portion. A first back gate electrode and a second back gate electrode are arranged under the insulating layer, respectively opposite the first portion and the second portion.

21 Claims, 2 Drawing Sheets

(56) References Cited

U.S. PATENT DOCUMENTS

| | | |
|---|---|---|
| 8,581,310 B2 | 11/2013 | Wan et al. |
| 2007/0210418 A1 | 9/2007 | Nakajima |
| 2013/0100729 A1 | 4/2013 | Wan et al. |
| 2015/0061023 A1 | 3/2015 | Solaro et al. |
| 2015/0126002 A1 | 5/2015 | Arai et al. |

* cited by examiner

MEMORY CELL

CROSS-REFERENCE TO RELATED APPLICATIONS

This application claims the priority benefit of French patent application number 1658063, filed on Aug. 31, 2016, the content of which is hereby incorporated by reference in its entirety to the maximum extent allowable by law.

TECHNICAL FIELD

The present disclosure relates to a microelectronic component capable of being used as a memory cell.

BACKGROUND

FIG. 1 is a cross-section view schematically showing a memory cell described in an article of Jing Wan et al. entitled "Progress in $Z^2$-FET 1T-DRAM: Retention time, writing modes, selective array operation, and dual bit storage" published in 2013 in Solid-State Electronics, volume 84, pages 147 to 154.

The memory cell comprises a silicon layer 1 resting on an insulating layer 3, itself resting on a silicon substrate 5. A heavily-doped P-type drain region 7 ($P^+$) and a heavily-doped N-type source region 9 ($N^+$) are arranged in silicon layer 1 and are separated from one another by a non-doped region 11 of silicon layer 1. On the side of drain region 7, the memory cell comprises an insulated front gate electrode 13 (insulator 15) resting on a portion only of region 11 of layer 1. Insulated gate 13, drain region 7, and source region 9 are connected to respective nodes G, D, and S.

In operation, a −2-V negative bias voltage is applied to substrate 5 and a reference voltage, the ground, is applied to node S. To read or write one or the other of two binary values from or into the memory cell, control voltages are applied to nodes D and G in the form of pulses. The values of the control voltages and the operation of the memory cell are described in further detail in the above-mentioned article.

SUMMARY

Tests have shown that the memory cell of this article only operates if the control pulses applied to front gate 13 are strictly greater than 1V in absolute value, which is not compatible with low power consumption applications.

Embodiments of the present disclosure relate to a microelectronic component capable of being used as a memory cell, for example, a memory cell adapted to low electric power consumption applications. Thus, an embodiment provides a memory cell that overcomes at least some of the disadvantages of the memory cell of FIG. 1.

An embodiment provides an microelectronic device comprising a semiconductor layer resting on an insulating layer and comprising a doped source region of a first conductivity type, a doped drain region of a second conductivity type, and an intermediate region, non-doped or more lightly doped, with the second conductivity type, than the drain region. The intermediate region comprises first and second portions respectively extending from the drain region and from the source region. An insulated front gate electrode rests on the first portion. A first back gate electrode is arranged under the insulating layer, opposite the first portion, and a second back gate electrode is arranged under the insulating layer, opposite the second portion.

An embodiment provides a memory cell comprising the above component, and further comprising a controller capable of supplying a first bias voltage to the first back gate electrode, a second bias voltage, different from the first bias voltage, to the second back gate electrode, a reference voltage to the source region, a first control signal to the drain region, and a second control signal to the front gate electrode.

According to an embodiment, the insulating layer rests on a silicon substrate, the first back gate electrode comprises a doped silicon region of the first conductivity type, and the second back gate electrode comprises a doped silicon region of the second conductivity type.

According to an embodiment, the semiconductor layer is made of silicon.

According to an embodiment, the thickness of the semiconductor layer is in the range from 5 to 30 nm, and the thickness of the insulating layer is in the range from 5 to 30 nm.

An embodiment provides a method of controlling the above memory cell, wherein: for the writing of a '1', the first control signal is set from the reference voltage to a first voltage level for a first time interval, and the second control signal is set from a second voltage level to the reference voltage for a second time interval included within the first interval; for the writing of a '0', the second control signal is set from the second voltage level to the reference voltage for a third time interval; and for a reading, the first control signal is set from the reference voltage to the first voltage level for a fourth time interval, the reference voltage being zero, the first voltage level and the second voltage level being greater in absolute value than the reference voltage.

According to an embodiment, for the writing of a '0', the first control signal is maintained at the reference voltage and, for the reading, the second control signal is maintained at the second voltage level.

According to an embodiment, when the first conductivity type is type N, the first voltage level and the second voltage level are positive, the first bias voltage is positive or zero and the second bias voltage is negative or zero; and when the first conductivity type is type P, the first voltage level and the second voltage level are negative, the first bias voltage is negative or zero and the second bias voltage is positive or zero.

According to an embodiment, the first voltage level and the second voltage level are lower than 1 V in absolute value.

According to an embodiment, between two successive read and/or write operations, the first control signal is maintained at the reference voltage and the second control signal is maintained at the second voltage level.

The foregoing and other features and advantages will be discussed in detail in the following non-limiting description of specific embodiments in connection with the accompanying drawings.

DETAILED DESCRIPTION OF ILLUSTRATIVE EMBODIMENTS

Figure 1:
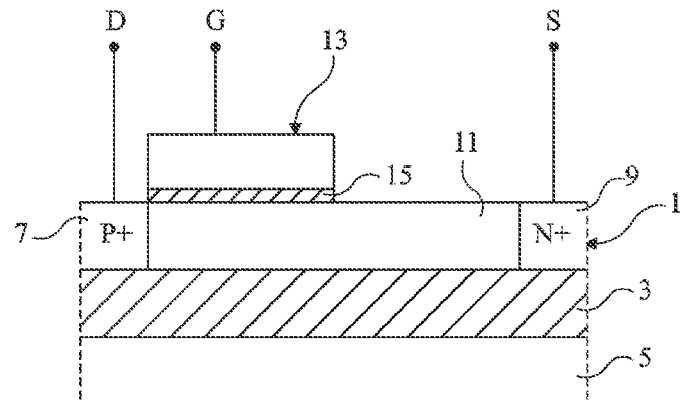
FIG. 1 is a cross-section view of an example of memory cell described in the Wan et al. paper discussed in the background.

The same elements have been designated with the same reference numerals in the various drawings and, further, the various drawings are not to scale. For clarity, only those steps and elements which are useful to the understanding of the described embodiments have been shown and are detailed.

In the following description, when reference is made to terms such as "front", "back", "on", "under", "upper", "lower", etc., it is referred to the orientation of the concerned elements in the corresponding drawings. Unless otherwise specified, term "substantially" means to within 10%, preferably to within 5%, and expression "resting on" means "resting on and in contact with".

Figure 2:
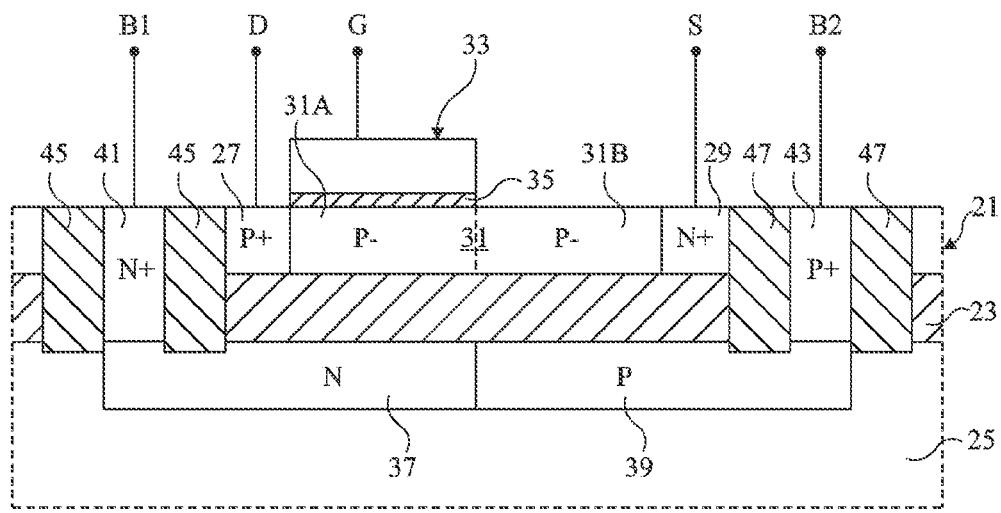
FIG. 2 is a cross-section view schematically showing an embodiment of a memory cell.

FIG. 2 is a cross-section view schematically showing an embodiment of a memory cell formed inside and on top of a SOI-type structure ("semiconductor on insulator") comprising a silicon layer 21 resting on an insulating layer 23, itself resting on a silicon substrate 25.

The memory cell comprises, in silicon layer 21, a heavily-doped P-type drain region 27 (Pt), and a heavily-doped N-type source region 29 ($N^+$). A portion 31 of silicon layer 21, called intermediate region 31 hereafter, extends from drain region 27 to source region 29 and separates regions 27 and 29 from each other. Intermediate region 31 is lightly P-type doped ($P^-$). Intermediate region 31 comprises a first portion 31A extending from drain region 27, and a second portion 31B extending from source region 29.

Preferably, portions 31A and 31B are in contact with each other. An insulated front gate electrode 33 (insulator 35) only rests on portion 31A of region 31, on all or part of portion 31A. Two back gate electrodes 37 and 39 are arranged in substrate 25, under insulating layer 23 and in contact therewith. Back gate electrode 37 comprises an N-type doped portion of substrate 25. Electrode 37 is arranged opposite portion 31A of intermediate region 31 and preferably extends all under portion 31A. Back gate electrode 39 comprises a portion of P-type doped substrate 25. Electrode 39 is arranged opposite portion 31B of region 31 and preferably extends all under portion 31B.

Drain region 27 and insulated front gate electrode 33 are connected to respective nodes D and G of application of control signals. Source region 29, back gate electrode 37, and back gate electrode 39 are connected to respective nodes S, B1, and B2 of application of bias voltages. The device can include a controller (not shown) that is adapted to supply the various bias voltages.

Thus, two bias voltages different from each other may be applied under insulating layer 23, opposite intermediate region 31. This differs from the memory cell of FIG. 1 where a single bias voltage is applied under the insulating layer.

In the embodiment shown in FIG. 2, electrode 37 is connected to node B1 via a heavily N-type doped silicon contact transfer region 41 ($N^+$) and electrode 39 is connected to node B2 by a heavily P-type doped silicon contact transfer region 43 ($P^+$). Each of contact transfer regions 41 and 43 extends from the upper surface of silicon layer 21 to the corresponding electrode 37 or 39. Region 41 is arranged in the vicinity of drain region 27 and is surrounded with an insulating wall 45. Similarly, contact transfer region 43 is arranged in the vicinity of source region 29 and is surrounded with an insulating wall 47.

As an example, the different previously-described regions, portions, and layers have the following dimensions:

- a thickness in the range from 5 to 30 nm, for example, 12 nm, for silicon layer 21;
- a width, taken between drain and source regions 27 and 29, in the range from 40 nm to 2 μm, for example, 400 nm, for intermediate region 31;
- a width substantially equal to half that of intermediate region 31, for example, 200 nm, for each of portions 31A and 31B of region 31; and
- a thickness in the range from 5 to 30 nm, for example, 20 nm, for insulating layer 23.

For a given technological process, the doping levels may be:

- in the range from $10^{17}$ to $10^{19}$ at·cm$^{-3}$, for example, $5\cdot10^{17}$ at·cm$^{-3}$, for the P-type doped regions;
- in the range from $10^{19}$ to $10^{21}$ at·cm$^{-3}$, for example, $10^{19}$ at·cm$^{-3}$, for the heavily-doped P-type doped regions (Pt);
- in the range from $10^{14}$ to $10^{16}$ at·cm$^{-3}$, for example, $10^{15}$ at·cm$^{-3}$, for the lightly-doped P-type doped regions ($P^-$);
- in the range from $10^{17}$ to $10^{19}$ at·cm$^{-3}$, for example, $10^{18}$ at·cm$^{-3}$, for the N-type doped regions; and
- in the range from $10^{19}$ to $10^{21}$ at·cm$^{-3}$, for example, $10^{20}$ at·cm$^{-3}$, for the heavily-doped N-type doped regions ($N^+$).

Three operating steps of the memory cell can be distinguished, that is:

- a step W1 of writing a first one of two binary values, for example, a '1', into the memory cell;
- a step W0 of writing the second one of the two binary values, for example, a '0', into the memory cell; and
- a step R of reading the written binary value from the memory cell. To simplify the description, a read step R carried out after a write step W1 and called R1 hereafter will be distinguished from a read step R carried out after a write step W0 and called R0 hereafter, it being understood that in practice, the memory cell is controlled in the same way during steps R1 and R0.

Between two successive read and/or write steps, the memory cell is in an idle or hold state.

Figure 3:
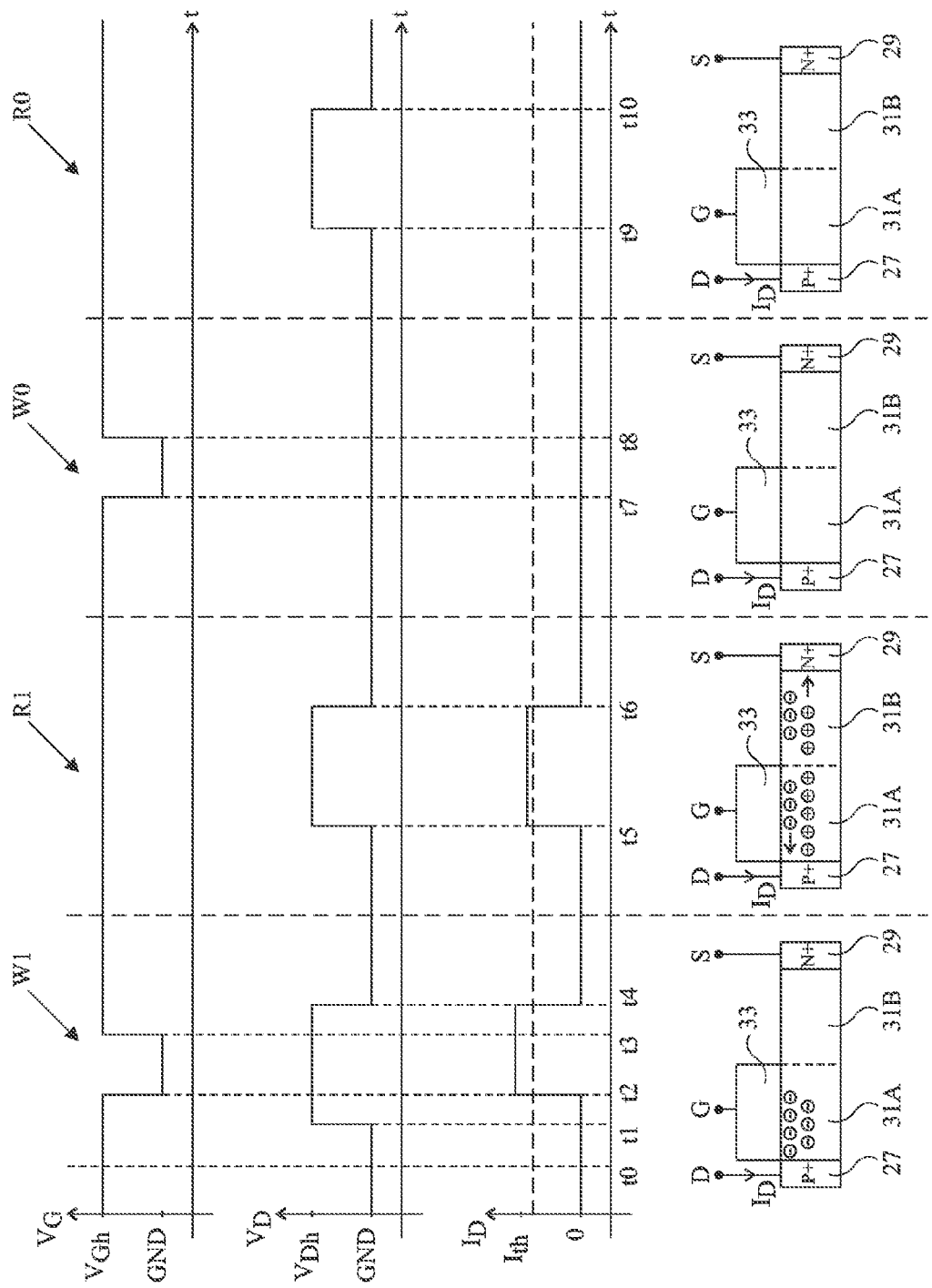
FIG. 3 shows timing diagrams illustrating an embodiment of a method of controlling the memory cell of FIG. 2.

FIG. 3 shows, for successive steps W1, R1, W0, R0 separated from one another by hold states, the timing diagrams of control signal $V_G$ applied to front gate node G, of control signal $V_D$ applied to drain node D, and of current $I_D$ entering drain region 27 from drain node D. The scale of abscissas is the same for $V_G$, $V_D$ and $I_D$. The timing diagrams are obtained for a memory cell such as described in relation with FIG. 2. FIG. 3 also shows, for each step W1, R1, W0, R0, regions 27, 29, and 31, insulated gate electrode 33, as well as the electric charges in the memory cell.

A negative bias voltage which may be in the range from 0 to −2 V, for example, −1 V, is permanently maintained on node B2 and a positive bias voltage, for example, 0.5 V, is permanently maintained on node B1. A zero reference voltage GND is permanently maintained on source node S.

In the hold state, for example, at an initial time to, a voltage level $V_{Gh}$ greater than 0.2 V, for example, 0.7 V, is maintained on front gate node G, and reference voltage GND is maintained on drain node D. Due to the zero voltage between drain and source regions 27 and 29, no charge flows between regions 27 and 29 and drain current $I_D$ is zero.

During a write step W1, a voltage pulse is applied to drain node D while a voltage pulse is applied to front gate node G. More particularly, a voltage level $V_{Dh}$ greater than 0.2 V, for example, 0.7 V, is maintained on node D between times t1 and t4, and reference voltage GND is maintained on node G between times t2 and t3. Between times t1 and t2, due to the biasing of gate electrodes 33, 37, and 39, the voltage between drain and source regions 27 and 29 is not sufficient for charges to flow between regions 27 and 29. Drain current $I_D$ is zero.

Between times t2 and t3, due to the passing of control signal $V_G$ from voltage level $V_{Gh}$ to voltage level GND, the voltage between drain and source regions 27 and 29 becomes sufficient for charges to flow between regions 27 and 29. Current $I_D$ is then positive. Between times t3 and t4, although control signal $V_G$ has returned to voltage level $V_{Gh}$, current $I_D$ remains positive and electrons are trapped in portion 31A, under gate electrode 33. From time t4, the voltage between regions 27 and 29 is zero and current $I_D$ becomes zero again. As shown under the timing diagrams, after a write step W1, electrons remain trapped, in portion 31A, under gate electrode 33.

During a read step R1, a voltage pulse $V_{Dh}$ is applied to drain node D, between times t5 and t6, while voltage $V_{Gh}$ is maintained on front gate node G. Thus, between times t5 and t6, the voltages applied to the memory cells are identical to those applied between times t1 and t2. However, due to the fact that electrons are trapped under gate 33, the voltage between drain and source regions 27 and 29 is sufficient for charges to flow between regions 27 and 29, as shown under the timing diagrams. Current $I_D$ is then positive and remains so as long as control signal $V_D$ is maintained at voltage level $V_{Dh}$. Current $I_D$ is greater than a threshold value $I_{th}$, for example, 1 µA, indicating that the previous write step corresponds to a write step W1. It should be noted that $I_D$ may be smaller than during write step W1 due to the fact that control signal $V_G$ is maintained at voltage level $V_{Gh}$.

During a write step W0, a voltage pulse GND is applied to front gate node G, between times t7 and t8, while reference voltage GND is maintained on drain node D. As a result, the electrons trapped under front gate 33 during a previous write step W1 are drained off to drain region 27. At the end of write step W0, there thus are no further trapped electrons under front gate 33, as shown under the timing diagrams.

During a read step R0, a voltage pulse $V_{Dh}$ is applied to drain node D, between times t9 and t10, while voltage $V_{Gh}$ is maintained on front gate node G. Due to the fact that there are no trapped electrons under gate 33, the voltage between nodes D and S is not sufficient to cause the creation of a positive current $I_D$, conversely to what has been described for read step R1. As shown under the timing diagrams, no charge flows between regions 27 and 29 and current $I_D$ is zero. Current $I_D$ is smaller than threshold value $I_{th}$, indicating that the previous write step corresponds to a write step W0.

In the memory cell of FIG. 2, voltage level $V_{Dh}$ causing the creation of a non-zero current $I_D$ during write or read steps W1 or R1 may advantageously be chosen to be smaller than 1 V. Further, due to the fact that the positive biasing of back electrode 37 tends to block the flowing of electric charges from drain region 27 to region 29 through portion 31A of intermediate region 31, voltage level $V_{Gh}$ blocking the flowing of electric charges into portion 31A, in particular during read steps R0, may advantageously be chosen to be smaller than 1 V. This is not possible in the memory cell of FIG. 1 where the voltage level applied to gate 13 should enable alone to block the flowing of electric charges from the drain region to the source region while the negative biasing of the substrate tends to favor the flowing of the electric charges. Advantageously, the bias voltages applied to nodes B1 and B2 may also be chosen to be smaller than 1 V in absolute value.

The memory cell described herein is more particularly adapted to a use in a refreshment memory, for example, a DRAM-type memory ("Dynamic Random Access Memory"). Indeed, after a step W0 of writing a '0', when a leakage current flows between the source and drain regions, electrons are stored under front gate 33, whereby, after some time, the memory cell is in the same state as after a step W1 of writing a '1'.

As an example, the voltage pulses applied to front gate node G have substantially the same duration as during a write step W1 or W0, and such a duration may be in the range from 1 to 100 ns, for example, 15 ns. The voltage pulses applied to drain node D have substantially the same duration as during a read step R or write step W0 or W1, and such a duration may be in the range from 1 to 100 ns, for example, 20 ns. The different voltage levels of the control signals and/or the above-described bias voltages may be provided by one or a plurality of control circuits, not described. In the case of an array of memory cells of the type in FIG. 2, a same control circuit may be common to a plurality of memory cells of the array, for example, to all the memory cells of a same row.

Specific embodiments have been described. Various alterations, modifications, and improvements will readily occur to those skilled in the art.

An example of operation of the memory cell of FIG. 2 in the case where the voltage levels of the control signals are smaller than 1 V in absolute value for a low power consumption application has been described. The bias and control voltages of the memory cell may be modified. In particular, control voltage levels greater than 1 V in absolute value may be selected to control the memory cell. For example, it may be provided to adapt the voltages applied to the memory cell during the operation thereof to have it switch from a nominal state to a low power consumption state, or conversely.

The control method described in relation with FIG. 3 may be modified. For example, the voltage pulses applied to drain node D and to front gate node G may have the same duration and, in this case, the pulses will be simultaneous during step W1 of writing a '1'. Other control methods than that previously described may be implemented to read into and write from the memory cell of FIG. 2. For example, the different read and write methods described in J. Wan et al.'s above-mentioned article to read from and write into a memory cell of the type in FIG. 1 may be adapted by those skilled in the art to read from and write into the memory cell of FIG. 2.

It has been previously indicated that the first and second binary values correspond to a '1' and to a '0'. This choice is arbitrary and may be inverted.

A plurality of write steps may be carried out before each read step and, in this case, the binary value read during the read step corresponds to the last written binary value. It may also be provided to carry out a plurality of successive read steps between two write steps.

The conductivity types indicated hereabove for the various layers, regions, and portions of the memory cell of FIG. 2 may all be inverted by adapting the applied bias and control voltages (the positive voltage and current values then being negative, and conversely).

Layer 21 may be replaced with a semiconductor layer made of a material other than silicon, for example, made of silicon-germanium. Intermediate region 31 may be non-doped.

The dimensions of the different layers, regions, and portions indicated hereabove as an example may be modified. For example, portion 31A may be provided to have a width smaller than that of portion 31B.

Electric insulation may be provided, under insulating layer 23, between the two back gate electrodes 37 and 39, and/or each of back gate electrodes 37 and 39 may extend under a portion only of the corresponding portion 31A or 31B. In the case where back gate electrodes 37 and 39 are not in electric contact with each other, they may be made of another material than doped silicon, for example, of a metal selected from the group comprising copper, aluminum, tungsten, or of an alloy of a plurality of metals from this group.

The contact transfer areas may be replaced with metal vias extending from the upper surface of layer 21 or from the lower surface of substrate 25 all the way to the corresponding back electrode.

Silicon substrate 25 may be replaced with any other substrate, for example, a glass substrate.

Although the component of FIG. 2 has been described in uses as a memory cell, this component may be used in other applications. For example, this component may be used to protect a component against overvoltages, for example, overvoltages causes by electrostatic discharges (ESD). To achieve this, control signal $V_G$ is permanently set to voltage level $V_{Gh}$ and the component to be protected is connected in parallel with the component of FIG. 2, between nodes D and S. Tests have shown that, advantageously, the voltage difference between drain and source nodes D and S causing the flowing of a current $I_D$ between nodes D and S to short the component to be protected is higher, in absolute value, than each of the voltage levels applied to the component of FIG. 2.

The component described in relation with FIG. 2 may also be used as a controlled switch. In this case, a digital or analog signal to be transmitted, for example, a radio signal, is applied to node D. Between nodes D and S, the component behaves as an on switch when control signal $V_G$ is set to voltage $V_{Gh}$, and as an off switch when control signal $V_G$ is set to reference voltage GND. Tests have shown that the switching between the on and off states of a controlled switch may be performed with control signals having lower voltage levels in the case where the switch is formed with the component of the drawing than in the case where the switch is formed with a thyristor. This advantage particularly results from the fact that, in the component of FIG. 2, two different bias voltages are applied under insulating layer 23, opposite respective portions 31A and 31B.

Various embodiments with different variations have been described hereabove. It should be noted that those skilled in the art may combine various elements of these various embodiments and variations without showing any inventive step.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A microelectronic component comprising:
   an insulating layer;
   a semiconductor layer overlying the insulating layer and including a doped source region of a first conductivity type, a doped drain region of a second conductivity type, and an intermediate region of the second conductivity type, the intermediate region being non-doped or more lightly doped than the drain region and including a first portion extending from the drain region and a second portion extending from the source region;
   an insulated front gate electrode overlying the first portion;
   a first back gate electrode arranged under the insulating layer, opposite the first portion; and
   a second back gate electrode arranged under the insulating layer, opposite the second portion.

2. The microelectronic component of claim 1, further comprising a silicon substrate, wherein the insulating layer overlies the silicon substrate, the first back gate electrode including a first doped silicon region of the silicon substrate and being of the first conductivity type, and the second back gate electrode including a second doped silicon region of the silicon substrate and being of the second conductivity type.

3. The microelectronic component of claim 1, wherein the semiconductor layer comprises silicon.

4. The microelectronic component of claim 1, wherein the semiconductor layer has a thickness between 5 and 30 nm, and wherein the insulating layer has a thickness between 5 and 30 nm.

5. The microelectronic component of claim 1, further comprising a controller adapted to supply a first bias voltage to the first back gate electrode, a second bias voltage, different from the first bias voltage, to the second back gate electrode, a reference voltage to the source region, a first control signal to the drain region, and a second control signal to the front gate electrode.

6. The microelectronic component of claim 5, further comprising a silicon substrate, wherein the insulating layer overlies the silicon substrate, the first back gate electrode including a first doped silicon region of the silicon substrate and being of the first conductivity type, and the second back gate electrode including a second doped silicon region of the silicon substrate and being of the second conductivity type.

7. The microelectronic component of claim 5, wherein the semiconductor layer comprises silicon.

8. The microelectronic component of claim 5, wherein the semiconductor layer has a thickness between 5 and 30 nm, and wherein the insulating layer has a thickness between 5 and 30 nm.

9. A memory comprising:
   a memory cell that includes:
      a silicon substrate;
      an insulating layer that overlies the silicon substrate;
      a semiconductor layer overlying the insulating layer and including a doped source region of a first conductivity type, a doped drain region of a second conductivity type, and an intermediate region of the second conductivity type, the intermediate region being non-doped or more lightly doped than the drain region and including a first portion extending from the drain region and a second portion extending from the source region;
      an insulated front gate electrode overlying the first portion;
      a first back gate electrode arranged under the insulating layer, opposite the first portion, the first back gate electrode including a first doped silicon region of the silicon substrate and being of the first conductivity type; and
      a second back gate electrode arranged under the insulating layer, opposite the second portion, the second back gate electrode including a second doped silicon region including of the second conductivity type; and a controller adapted to supply a first bias voltage to the first back gate electrode, a second bias voltage that is different than the first bias voltage to the second back gate electrode, a reference voltage to the source region, a first control signal to the drain region, and a second control signal to the front gate electrode.

10. The memory according to claim 9, wherein the controller is adapted to:
   cause a first logic level to be programmed to the memory cell by setting the first control signal from the reference voltage to a first voltage level for a first time interval, and setting the second control signal from a second voltage level to the reference voltage for a second time interval included within the first time interval;
   cause a second logic level to be programmed to the memory cell by setting the second control signal from the second voltage level to the reference voltage for a third time interval; and
   read a logic value stored in the memory cell by setting the first control signal from the reference voltage to the first voltage level for a fourth time interval, the reference voltage being zero, the first voltage level and the second voltage level being greater in absolute value than the reference voltage.

11. The memory according to claim 9, wherein the controller is adapted to cause a first logic level to be programmed to the memory cell by setting the first control signal from the reference voltage to a first voltage level for a first time interval, and setting the second control signal from a second voltage level to the reference voltage for a second time interval included within the first time interval.

12. The memory according to claim 9, wherein the controller is adapted to cause a second logic level to be programmed to the memory cell by setting the second control signal from a second voltage level to the reference voltage for a third time interval.

13. The memory according to claim 9, wherein the controller is adapted to read a logic value stored in the memory cell by setting the first control signal from the reference voltage to a first voltage level for a fourth time interval.

14. The memory according to claim 9, wherein the semiconductor layer comprises silicon.

15. The memory according to claim 9, wherein the semiconductor layer has a thickness between 5 and 30 nm, and wherein the insulating layer has a thickness between 5 and 30 nm.

16. A method of controlling a memory cell that comprises an insulating layer; a semiconductor layer that overlies the insulating layer and comprises a doped source region of a first conductivity type, a doped drain region of a second conductivity type, and an intermediate region of the second conductivity type, the intermediate region being non-doped or more lightly doped than the drain region and including first portion extending from the drain region and a second portion extending from the source region; an insulated front gate electrode overlying the first portion, a first back gate electrode arranged under the insulating layer, opposite the first portion, and a second back gate electrode arranged under the insulating layer, opposite the second portion, the method comprising:
   applying a first bias voltage to the first back gate electrode while applying a second bias voltage that is different than the first bias voltage to the second back gate electrode, and applying a reference voltage to the source region.

writing a first logic value to the memory cell by setting a first control signal from the reference voltage to a first voltage level for a first time interval, and setting a second control signal from a second voltage level to the reference voltage for a second time interval included within the first time interval, the first control signal being applied to the drain region and the second control signal being applied to the front gate electrode;
writing a second logic value to the memory cell by setting the second control signal from the second voltage level to the reference voltage for a third time interval, the second control signal being applied to the front gate electrode; and
reading a logic value stored in the memory cell by setting the first control signal from the reference voltage to the first voltage level for a fourth time interval, the first control signal being applied to the drain region;
wherein the reference voltage is zero and wherein the first voltage level and the second voltage level are greater in absolute value than the reference voltage.

17. The method of claim 16, further comprising:
writing a first logic value to the memory cell by setting a first control signal from the reference voltage to a first voltage level for a first time interval, and setting a second control signal from a second voltage level to the reference voltage for a second time interval included within the first time interval, the first control signal being applied to the drain region and the second control signal being applied to the front gate electrode;
writing a second logic value to the memory cell by setting the second control signal from the second voltage level to the reference voltage for a third time interval, the second control signal being applied to the front gate electrode; and
reading a logic value stored in the memory cell by setting the first control signal from the reference voltage to the first voltage level for a fourth time interval, the first control signal being applied to the drain region, wherein:
the reference voltage is zero and the first voltage level and the second voltage level are greater in absolute value than the reference voltage; and
writing the second logic value comprises maintaining the first control signal at the reference voltage and, wherein the reading comprises maintaining the second control signal at the second voltage level.

18. The method of claim 16, further comprising:
writing a first logic value to the memory cell by setting a first control signal from the reference voltage to a first voltage level for a first time interval, and setting a second control signal from a second voltage level to the reference voltage for a second time interval included within the first time interval, the first control signal being applied to the drain region and the second control signal being applied to the front gate electrode;
writing a second logic value to the memory cell by setting the second control signal from the second voltage level to the reference voltage for a third time interval, the second control signal being applied to the front gate electrode; and
reading a logic value stored in the memory cell by setting the first control signal from the reference voltage to the first voltage level for a fourth time interval, the first control signal being applied to the drain region, wherein:

the reference voltage is zero and the first voltage level and the second voltage level are greater in absolute value than the reference voltage; and the first conductivity type is type N, the first voltage level and the second voltage level are positive, the first bias voltage is positive or zero, and the second bias voltage is negative or zero.

19. The method of claim 16, further comprising:

writing a first logic value to the memory cell by setting a first control signal from the reference voltage to a first voltage level for a first time interval, and setting a second control signal from a second voltage level to the reference voltage for a second time interval included within the first time interval, the first control signal being applied to the drain region and the second control signal being applied to the front gate electrode;

writing a second logic value to the memory cell by setting the second control signal from the second voltage level to the reference voltage for a third time interval, the second control signal being applied to the front gate electrode; and reading a logic value stored in the memory cell by setting the first control signal from the reference voltage to the first voltage level for a fourth time interval, the first control signal being applied to the drain region, wherein:

the reference voltage is zero and the first voltage level and the second voltage level are greater in absolute value than the reference voltage; and the first conductivity type is type P, the first voltage level and the second voltage level are negative, the first bias voltage is negative or zero and the second bias voltage is positive or zero.

20. The method of claim 16, further comprising:

writing a first logic value to the memory cell by setting a first control signal from the reference voltage to a first voltage level for a first time interval, and setting a second control signal from a second voltage level to the reference voltage for a second time interval included within the first time interval, the first control signal being applied to the drain region and the second control signal being applied to the front gate electrode;

writing a second logic value to the memory cell by setting the second control signal from the second voltage level to the reference voltage for a third time interval, the second control signal being applied to the front gate electrode; and reading a logic value stored in the memory cell by setting the first control signal from the reference voltage to the first voltage level for a fourth time interval, the first control signal being applied to the drain region, wherein:

the reference voltage is zero and the first voltage level and the second voltage level are greater in absolute value than the reference voltage; and the first voltage level and the second voltage level are smaller than 1 V in absolute value.

21. The method of claim 16, further comprising:

writing a first logic value to the memory cell by setting a first control signal from the reference voltage to a first voltage level for a first time interval, and setting a second control signal from a second voltage level to the reference voltage for a second time interval included within the first time interval, the first control signal being applied to the drain region and the second control signal being applied to the front gate electrode;

writing a second logic value to the memory cell by setting the second control signal from the second voltage level to the reference voltage for a third time interval, the second control signal being applied to the front gate electrode; and reading a logic value stored in the memory cell by setting the first control signal from the reference voltage to the first voltage level for a fourth time interval, the first control signal being applied to the drain region, wherein:

the reference voltage is zero and the first voltage level and the second voltage level are greater in absolute value than the reference voltage; and between two successive read or write operations, the first control signal is maintained at the reference voltage and the second control signal is maintained at the second voltage level.

* * * * *

UNITED STATES PATENT AND TRADEMARK OFFICE
CERTIFICATE OF CORRECTION

PATENT NO. : 9,905,565 B1
APPLICATION NO. : 15/464537
DATED : February 27, 2018
INVENTOR(S) : Hassan El Dirani et al.

Page 1 of 1

It is certified that error appears in the above-identified patent and that said Letters Patent is hereby corrected as shown below:

In the Claims

Column 10, Claim 16, Lines 1-21:
Delete "writing a first logic value to the memory cell by setting a first control signal from the reference voltage to a first voltage level for a first time interval, and setting a second control signal from a second voltage level to the reference voltage for a second time interval included within the first time interval, the first control signal being applied to the drain region and the second control signal being applied to the front gate electrode; writing a second logic value to the memory cell by setting the second control signal from the second voltage level to the reference voltage for a third time interval, the second control signal being applied to the front gate electrode; and reading a logic value stored in the memory cell by setting the first control signal from the reference voltage to the first voltage level for a fourth time interval, the first control signal being applied to the drain region; wherein the reference voltage is zero and wherein the first voltage level and the second voltage level are greater in absolute value than the reference voltage.".

Signed and Sealed this
Thirtieth Day of April, 2019

Andrei Iancu
*Director of the United States Patent and Trademark Office*